United States Patent [19]

Crimmins

[11] Patent Number: 4,724,381
[45] Date of Patent: Feb. 9, 1988

[54] RF ANTENNA FOR TRANSMISSION LINE SENSOR

[75] Inventor: James Crimmins, Wilton, Conn.

[73] Assignee: Niagara Mohawk Power Corporation, Syracuse, N.Y.

[21] Appl. No.: 825,623

[22] Filed: Feb. 3, 1986

[51] Int. Cl.$^4$ .......................................... G01R 31/02
[52] U.S. Cl. .................................. 324/127; 340/310 R
[58] Field of Search ....................... 324/96, 126, 127; 343/703; 340/310 R, 870.31

[56] References Cited

U.S. PATENT DOCUMENTS

| | | | |
|---|---|---|---|
| 3,428,896 | 2/1969 | Schweitzer, Jr. | 324/127 |
| 3,453,544 | 7/1969 | Schweitzer, Jr. | 324/127 |
| 3,460,042 | 8/1969 | Harner | 343/703 |
| 3,633,191 | 1/1972 | Engelhardt et al. | 340/870.17 |
| 3,993,989 | 11/1976 | Held et al. | 340/310 R |
| 4,118,668 | 10/1978 | Strayer, Jr. | 324/96 |
| 4,126,825 | 11/1978 | Houston et al. | 324/96 |
| 4,142,143 | 2/1979 | Daniel | 324/127 |
| 4,142,178 | 2/1979 | Whyte et al. | 340/310 R |
| 4,160,210 | 7/1979 | Molinari | 455/287 |
| 4,268,818 | 5/1981 | Dabis et al. | 174/146 |
| 4,384,289 | 5/1983 | Stillwell et al. | 324/126 |

FOREIGN PATENT DOCUMENTS

1155829  10/1963  France ................................ 324/126

Primary Examiner—Reinhard J. Eisenzopf
Assistant Examiner—W. Burns
Attorney, Agent, or Firm—Lalos & Keegan

[57] ABSTRACT

A radiating antenna system for a self-contained sensor module mounted on a power transmission line. The module is capable of measuring various parameters such as line current, voltage, conductor temperature, and ambient temperature. The parameter values are processed by sensor electronics and the processed values are transmitted to a ground receiver. The antenna system includes the power transmission line itself, the housing of the sensor module and an impedance matching network. The impedance matching network couples the output of the transmitter to the housing which radiates at the operating frequency of the transmitter. The housing includes apparatus for capacity coupling the hub of the housing to the transmission line at high frequencies.

11 Claims, 8 Drawing Figures

RF ANTENNA FOR TRANSMISSION LINE SENSOR

CROSS-REFERENCE TO RELATED APPLICATIONS

This application is related to copending applications Ser. No. 484,681, now U.S. Pat. No. 4,689,752, filed Apr. 13, 1983, Ser. No. 564,924, filed Dec. 23, 1983, now U.S. Pat. No. 4,635,055, Ser. No. 669,589, filed Nov. 8, 1984, which applications are incorporated herein by reference. This application is also related to the application of Roosevelt A. Fernandes, entitled Transmission Line Sensor Apparatus Operable with Minimum Current and Zero Current Line Conditions, Ser. No. 795,226, filed Nov. 5, 1985, now abandoned, and the application of Roosevelt A. Fernandes and Richard L. Sieron, entitled Transmission Line Sensor Apparatus Operable With Near Zero Current Line Conditions, Ser. No. 795,167, filed Nov. 5, 1985, which applications are incorporated herein by reference.

BACKGROUND OF THE INVENTION

This invention relates to apparatus for measuring operating parameters of a high voltage power conductor. More particularly, it relates to radio transmitting sensors which can be permanently mounted on an overhead power transmission line or portable sensors which are connected to a transmission line at arbitrary points for short periods. The permanently mounted sensors normally derive their operating power through electromagnetic induction using the magnetic field generated as a result of current flowing through the transmission line conductor. Transmission line sensors of the above type are disclosed in the United States Patent of Howard R. Stillwell and Roosevelt A. Fernandes entitled Transponder Unit for Measuring Temperature and Current on Live Transmission Lines, U.S. Pat. No. 4,384,289, issued May 17, 1983, which patent is incorporated herein by reference. Various other power line sensors, disclosed in the prior art, have been proposed for dynamic line rating of electrical power transmission lines. For examples, see U.S. Pat. Nos. 3,428,896, 3,633,191, 4,158,810, and 4,268,818.

The power line sensors available in the prior art measure quantities associated with the operation of the overhead line such as voltage on the conductor, current flow in the conductor, conductor temperature and ambient temperature. These measured parameters are transmitted by the sensor to a local ground station. Data from the various ground stations is then transmitted to a central control station where the information is analyzed. Based on this analysis, the entire power system is controlled with power being supplied to the various transmission lines in accordance with their measured parameters.

The compact toroidal-shaped sensors, disclosed in U.S. Pat. No. 4,384,289 and in the prior copending applications of Fernandes et al. contain the sensor electronics, power supply and transmitter circuits, and hardware for attaching the sensors to the transmission lines. These sensors generally derive their operating power from current flowing in the conductor but can also be operated by a battery when the line current is at a minimal or zero level. The sensor module power supply operates the electronics to process the measured parameters and the transmitter to transmit the processed values. These processed values are normally transmitted by antennas which tend to be highly directional such as a dipole antenna or patch antenna attached to the exterior of the sensor housing. These antennas are functional in a limited frquency range and are tuned to the particular operating frequency of the transmitter.

The present invention overcomes the disadvantages of the antenna apparatus used in prior systems by utilizing both the toroidal housing of the sensor module and the transmission line conductor itself to radiate the radio frequency signals from the transmitter. An impedance matching network is connected between the output of the transmitter and the housing of the sensor module. This network matches the operating frequency of the transmitter, which in the preferred embodiment is 950 MHz, to the impedance of the housing of the toroidal sensor module. The broadband tuning effect of the impedance matching network matches the resonant characteristics of the housing to the operating frequency of the transmitter. The housing of the sensor module, in combination with the impedance matching network, acts tuned as a resonating choke which permits the transmitter to drive the transmission line against the plane of the housing. Metal rings separated by an insulation layer in the module housing function to tightly capacitively couple the module hub to the transmission line conductor at high frequencies. The transmission line conductor acts as a nonresonant wire antenna which functions to radiate the transmitter signals into space. The impedance matching network, the toroidal housing of the module, and the line conductor provide a broadband antenna system with desirable gain and directivity characteristics for transmitting the processed line values to a remote ground station.

It is therefore an object of the present invention to provide an improved antenna system for use in a power transmission line monitoring system.

Another object is to provide an antenna with a desirrable radiation pattern with improved gain and directivity characteristics for transmitting signals to a remote ground station.

A further object of the invention is to provide an antenna system with an improved impedance matching network providing broadband capabilities.

Another object of the invention is to provide an antenna system which utilizes the toroidal housing of a transmission line sensor as a resonating choke to drive the hub of the housing to radiate high frequency signals.

Still another object of the invention is to utilize the transmission line conductor in cooperation with the sensor module housing as a line antenna for radiating signals to a remote station.

These and other objects and advantages of the invention will be apparent from the following detailed description and drawings.

DETAILED DESCRIPTION

The transmission line sensors embodying the present invention monitor a variety of conductor parameters. Each sensor is equipped to measure line current, line to neutral voltage, frequency, phase angle, conductor temperature and ambient temperature. The values of the monitored parameters are fed to a central location which uses the information to control an entire transmission system.

Figure 1:
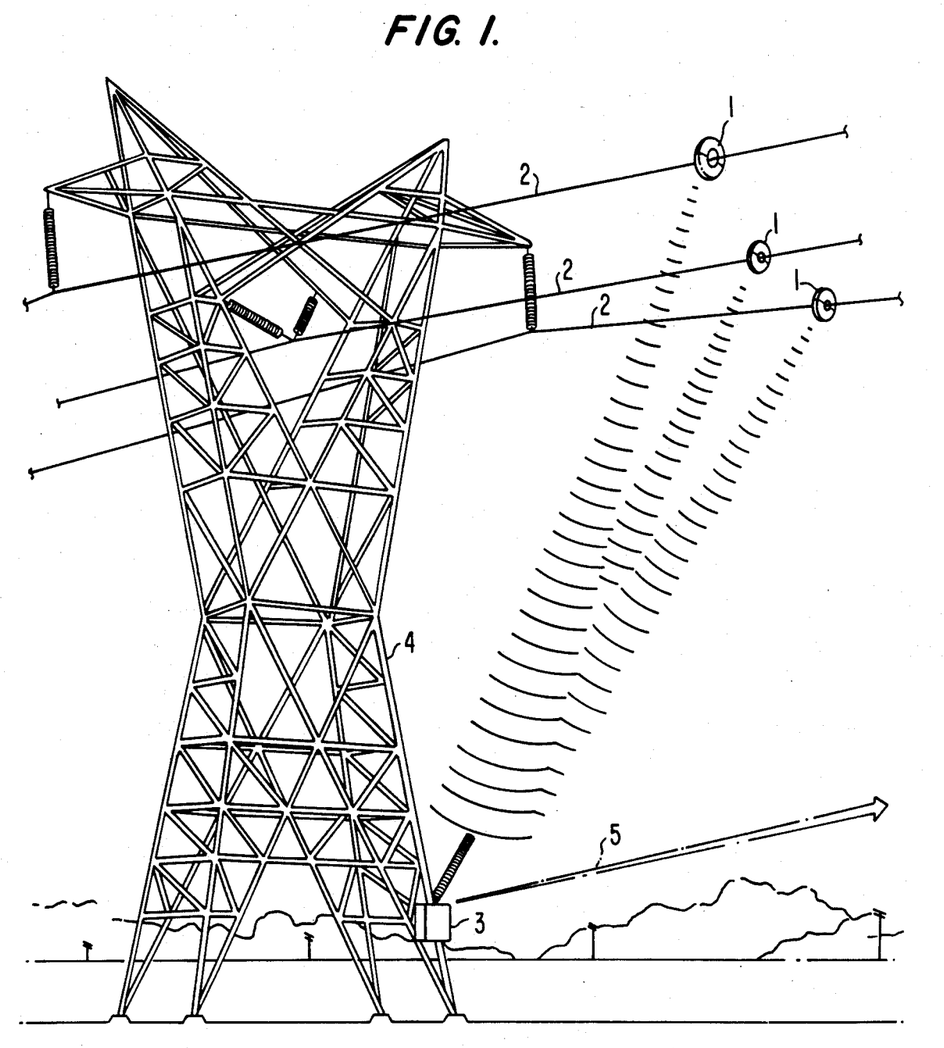
FIG. 1 is a view of several sensor modules attached to the three phase conductors of an electric power line and apparatus for transmitting the measured parameters.

FIG. 1 illustrates several sensors 1 mounted on power conductors 2. Each sensor includes electronics which process and digitize the parameter values and assemble the digital data into appropriate encoded messages. Sensor module electronics include a microprocessor, RAM, I/O and timer components as disclosed in copending application Ser. No. 484,681. The digital data is transmitted by the sensor modules 1 to a local ground station 3 which may be mounted on an electrical transmission tower 4. The digital data is transmitted, for example, by means of a 950 MHz FM radio link in a 16 millisecond burst.

Ground station 3 includes a microprocessor which further processes the data. For example, data received from the 3 phase set of FIG. 1 can be used to calculate power parameters such as total circuit kilowatts, kilovars and voltamps. The ground station 3 includes provisions for conversion of data to the form and parameters required by the central station.

Ground station 3 transmits its data to a central monitoring host computer (typically once a second) over data link 5 (e.g.-radio, land lines or satellite channels). The measured data is then processed by the control computer which issues appropriate control signals over other transmission links to switchgear at electrical substations. Thus the power supply to transmission lines may be varied in accordance with their measured temperature and electrical parameters.

Figure 2:
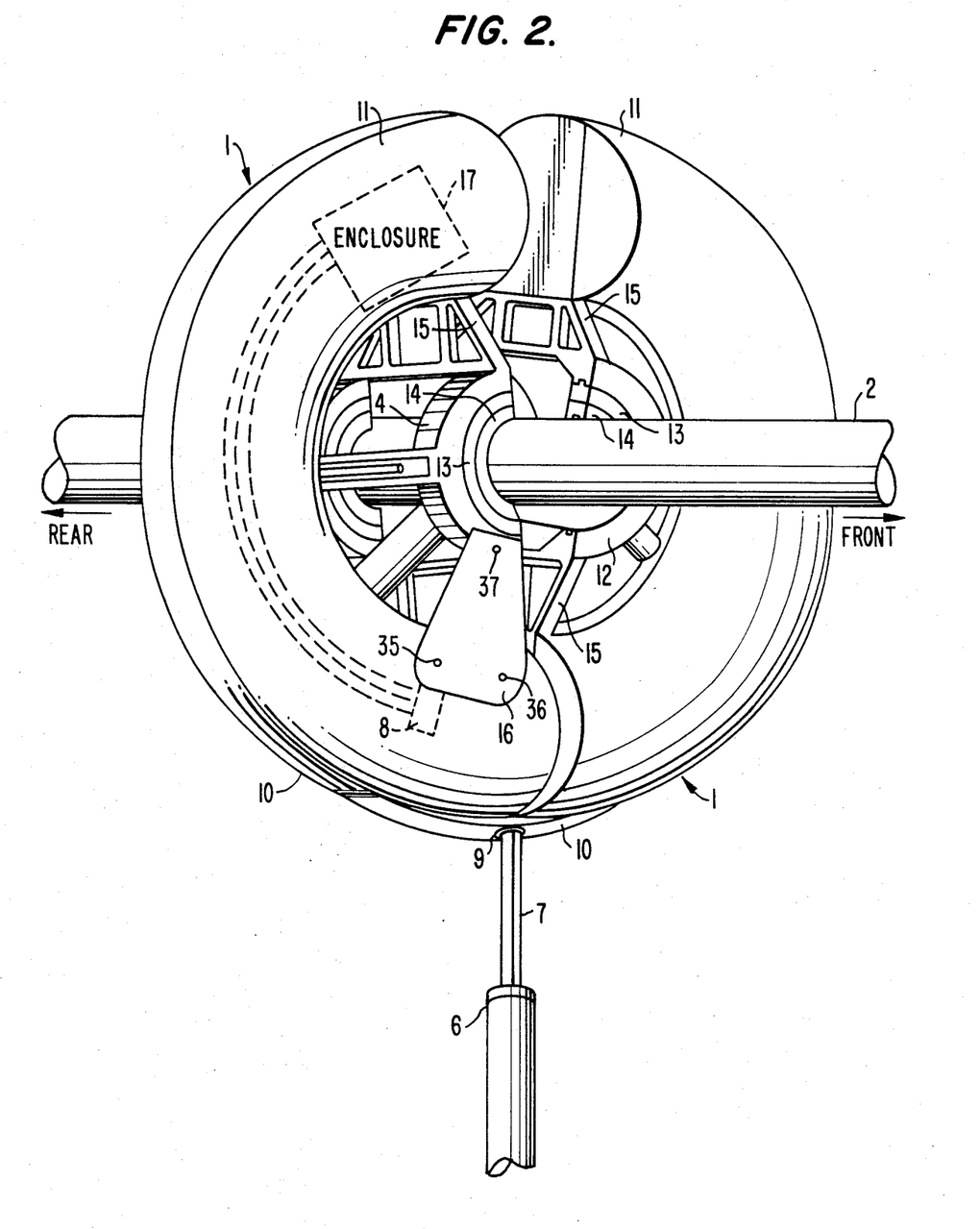
FIG. 2 is a view of a permanent or semi-permanent sensor module embodying the present invention being mounted on a transmission line.

The sensor modules can be placed throughout the power transmission system to monitor line characteristics and ensure effective reliable system control. As illustrated in FIG. 2, the modules 1 can be easily and quickly mounted on a line conductor 2 using a "hot stick" 6.

The size, shape, and operating characteristics of the sensor modules enable its use in a wide variety of conditions and situations. Each module is relatively small and shaped like a donut, with a 12⅝" major diameter and a maximum thickness of 4¾". It weighs approximately 18 pounds. Environmental operating conditions include: ambient air temperature range of −40° C. to +45° C.; driving rain, sleet, snow, and ice buildup; falling ice from overhead conductors; sun loading; and vibrations of conductors 2. All electronics within the module are sealed in water-tight compartments, and the module is protected against lightning surges by MOV devices and proper grounding and shielding. All exterior surfaces are rounded and free from sharp edges so as to prevent corona.

FIG. 2 illustrates the configuration of the sensor module's exterior. As shown in FIG. 2, the module contains two lower sections 10 and two covers or upper sections 11, held together by six bolts (not shown). Each lower section 10 is provided with outer half rings 13 and inner half rings 14, supported by three open radial webs 15 of housing hub 4. The sensor housing, generally indicated at 1, is secured to a clamping jaws assembly 12 by the open radial webs 15. The diameter of the internal opening of the assembly is variable and is selected for each specific application. The assembly diameter can be chosen to accommodate different power cables from 0.5" to 2" in diameter. The R.F. impedance matching network 16 of the present invention is mounted near assembly 12 and is connected via coaxial cable parts 8 to a shielded transmitter and electronics shown generally at 17 inside module 1.

Also shown in FIG. 2 is a hot stick tool with an Allen wrench portion 7 which fits within a hole 9 in module 1 mounted on conductor 2. With the hot stick tool 6 inserted into module 1, the hot stick is turned in one direction to cause the module to split so that it can be placed over a conductor. Turning the hot stick in the opposite direction causes the module to close over the conductor and clamp onto it tightly. The tool 6 can then be removed by simply pulling it away. Reinsertion and turning will open the module and allow it to be removed from the transmission line. This placement/removal feature provides great flexibility in locating the modules in the transmission system.

Figure 3:
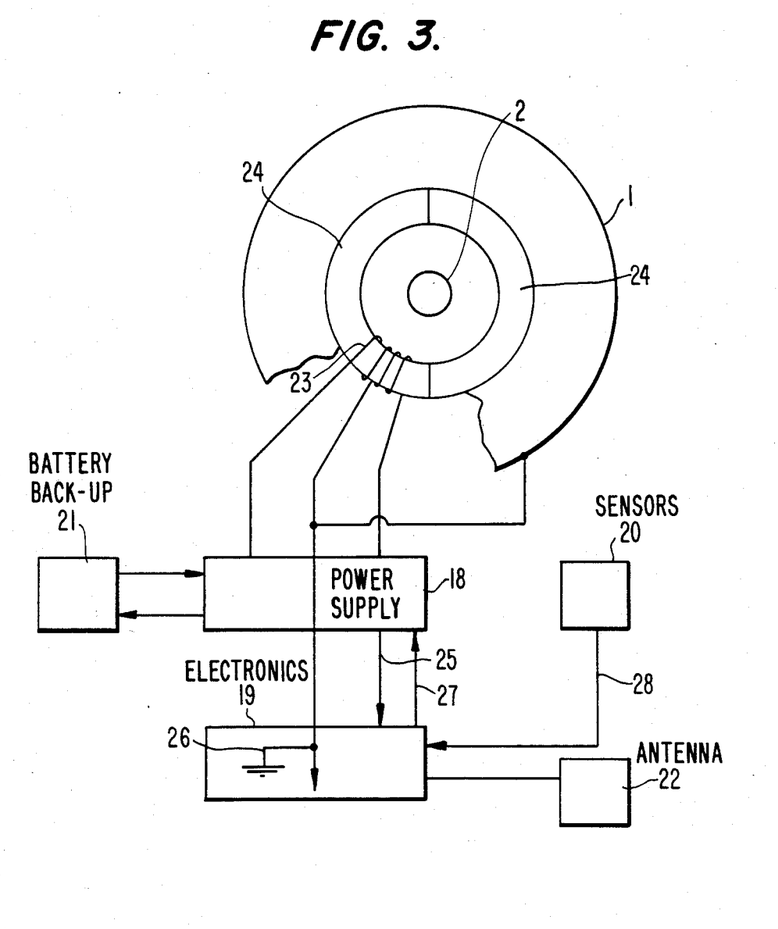
FIG. 3 is a general block diagram of the power supply system and electronics of a sensor module.
Figure 4:
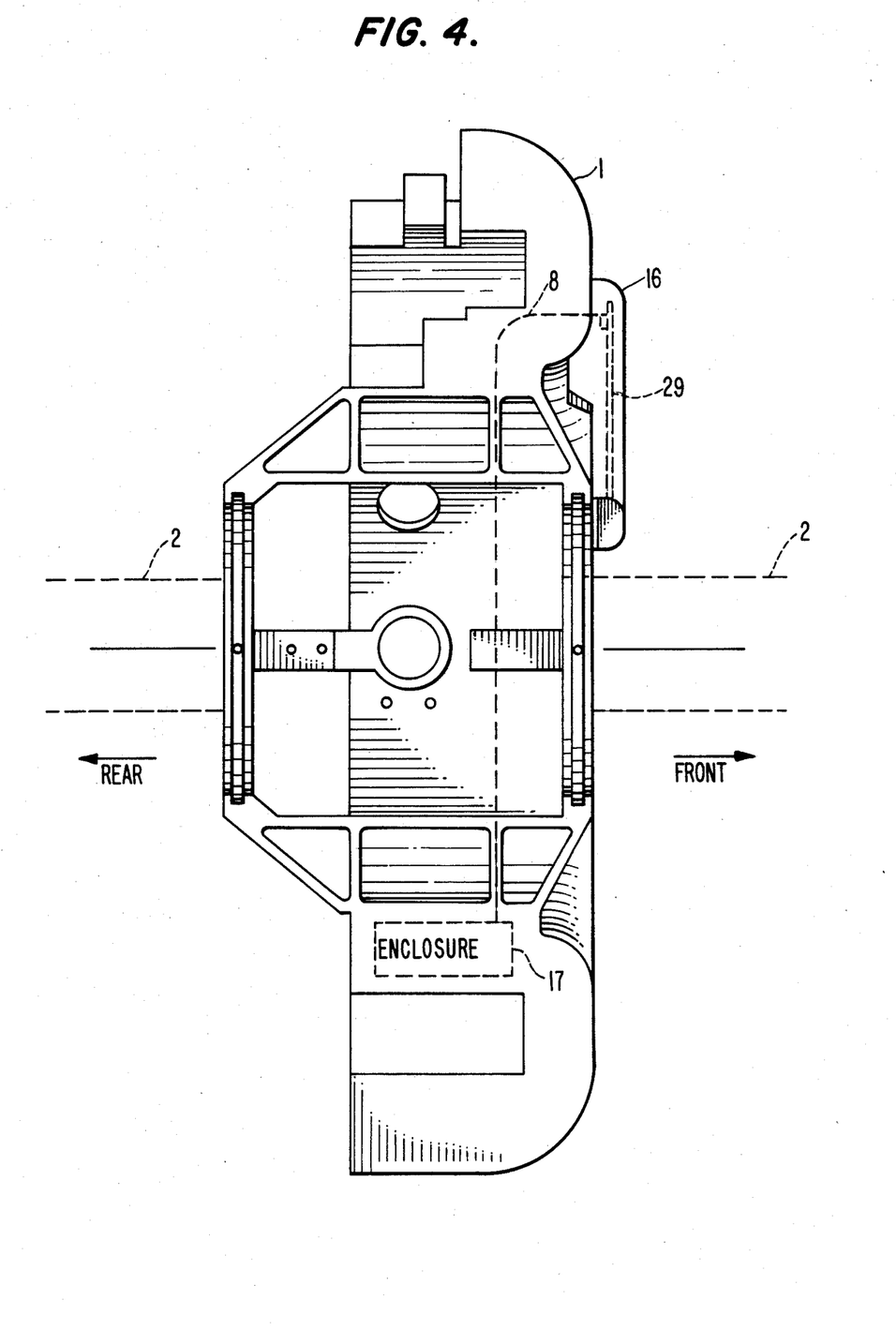
FIG. 4 is a vertical cross-sectional view of the sensor module showing the relative location of the impedance matching network and the shielded enclosure of the transmitter and sensor electronics.

FIG. 3 illustrates the electronics of sensor module 1 in their overall configuration. They comprise a power supply 18, digitizing and transmitting electronics 19, sensors 20, battery back-up apparatus shown generally as 21, and the antenna apparatus of the present invention shown generally as 22.

Power to operate the sensor module electronics is normally derived from winding 23 on a laminated iron core 24 which surrounds line conductor 2. This core is split to accommodate the opening of the module when it clamps around the conductor. The power supply 18 supplies regulated +5 and −5 volts to the electronics 19 and an additional switched +12 volts for the transmitter as indicated at 25. Local ground is indicated at 26. The electronics 19 provide a transmitter control signal on line 27 to control the power supply to the transmitter. The sensors 20 provide analog signals indicated at 28 to the electronics 19. A detailed electrical circuit diagram of power supply 18 and electronics 19 is disclosed in copending application Ser. No. 484,681.

FIGS. 2 and 4 through 7 illustrate the antenna system of the present invention. As stated above, operating parameters of the line conductor are measured by various sensors, processed by sensor electronics and then the processed information is transmitted to a local ground station. The antenna configuration of the present invention permits the toroidal housing of sensor module 1 and the line conductor 2 passing through the sensor to radiate the transmitted radio frequency signals toward the local ground station.

The antenna configuration of the present invention comprises three major elements (FIGS. 2 and 4)—the impedance matching network 16, the sensor module 1, and the line conductor 2. The impedance matching network is oriented radially outward on the housing of the sensor module. It is connected by coaxial cable 8 to a transmitter within a shielded enclosure shown generally in FIG. 2 as 17. The inductive and capacitive properties of network 16 are such that they match the operating frequency of the transmitter, which in the preferred embodiment is 950 MHz, to the impedance of the toroidal housing of sensor module 1. The impedance matching network 16 creates a tuning effect for the housing of the sensor and matches the resonant characteristics of the housing to the operating frequency of the transmitter. The housing of the sensor module 1 acts as a resonating choke which permits the transmitter to drive the transmission line against the plane of the housing. The radio frequency transmitter signals are capacitively coupled from the module hub to the power conductor 2 which acts as a nonresonant wire antenna. The effect is to provide a radiation pattern with enhanced directivity and gain.

Figure 5:
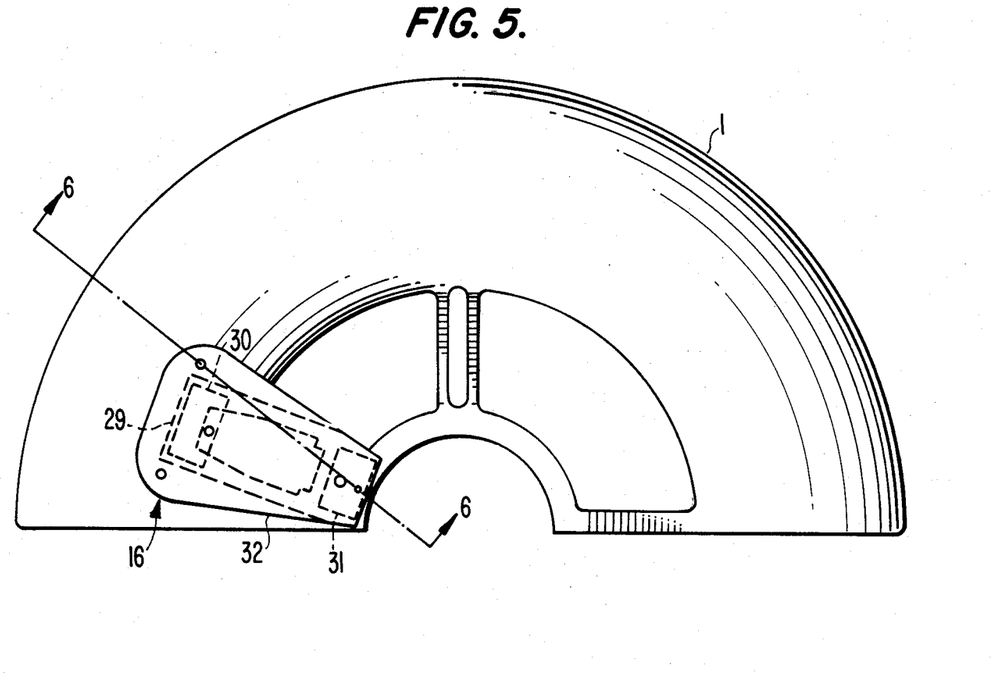
FIG. 5 shows the location of the impedance matching network on the housing of the sensor module and the printed circuit board located within the antenna dome of the impedance matching network.
Figure 6:
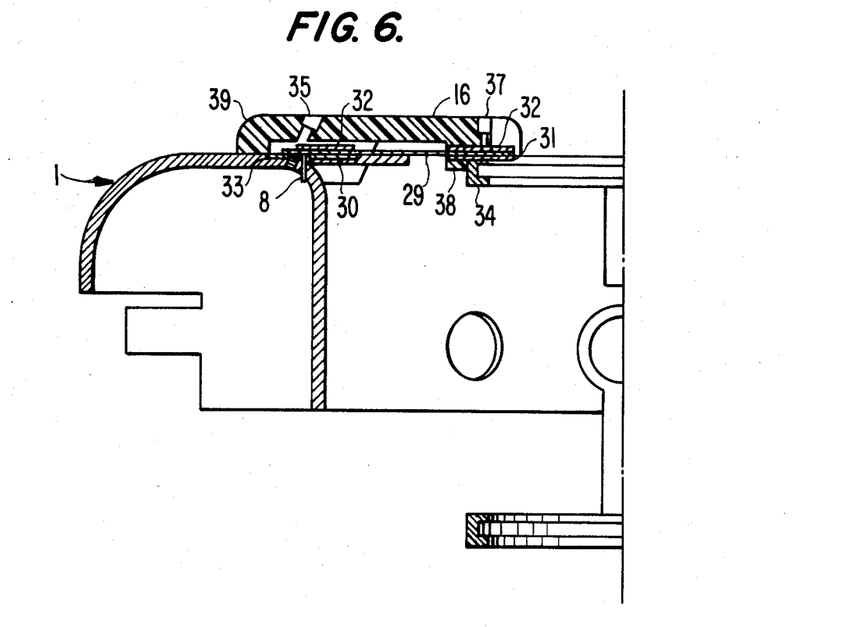
FIG. 6 is a cross-sectional view of the impedance matching network taken along line 6—6 of FIG. 5.

As best shown in FIGS. 5 and 6, the impedance matching network 16 is comprised of a printed circuit board 29 with copper cladding on both its upper and lower surfaces. The dimensions of the copper cladding sections 30 and 31 on the lower surface of board 29 and the dimensions of the copper cladding section 32 on the upper surface of board 29 are selected to form the proper inductive-capacitive network to match the output of the transmitter to the resonant characteristics of the housing of the sensor module 1.

Referring to FIG. 6, the printed circuit board 29 is insulated from the body of sensor module 1 at the end where coaxial cable 8 is connected by insulator 33. The opposite end of board 29, toward the center of module 1, is in mechanical contact with the body of sensor module 1 through spacer 34. Mechanical contact between printed circuit board 29 and module 1 is maintained by three bolts 35, 36, and 37 (FIGS. 2 and 6) which press board 29 against the housing of module 1 with low dielectric loss potting compound 38 separating the board 29 and the module 1. Potting compound 38 seals the printed circuit board 29 from moisture and insulates board 29 from module 1. Bolts 35, 36 and 37 engage threads in the body of module 1 and are electrically insulated from board 29 by the non-conductive material of antenna dome 39. The center conductor of coaxial cable 8 is connected to copper cladding section 32 on the upper surface of board 29 contacting the inner surface of antenna dome 39. The shield of coaxial cable 8 is connected to copper cladding section 30 on the lower surface of board 29.

Figure 7:
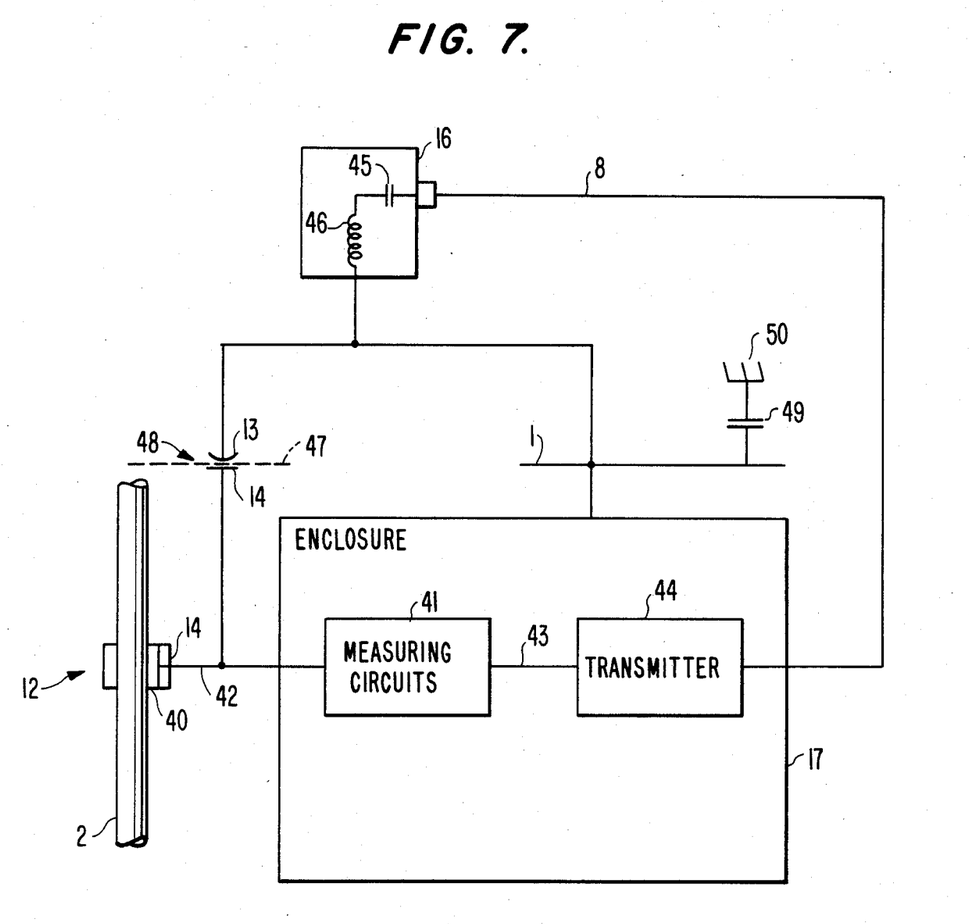
FIG. 7 is a block diagram of the equivalent electrical network of the antenna system of the present invention.

FIG. 7 represents the equivalent electrical network of the antenna configuration of the present invention. Sensor module 1 measures a variety of operating parameters of line conductor 2. One such parameter is the voltage potential of conductor 2. As explained in detail in copending application, Ser. Number 669,589, a conducting neoprene half ring 40 fits within an uninsulated space between half ring 14 and conductor 2. Ring 40 conducts a small amount of current to voltage measuring circuits 41 through conductor 42. Measurements made by voltage measuring circuit 41 are sent through conductor 43 to modulate the radio frequency signals generated by transmitter 44 within shield enclosure 17. These modulated radio frequency signals are sent to impedance matching network 16 through coaxial cable 8. The equivalent tuning capacitance 45 and inductance 46 of impedance matching network 16 are determined by the geometry and relative position of copper cladding sections 30, 31 and 32 of printed circuit board 29. Impedance matching network 16 matches the modulated radio frequency signals of transmitter 44 to the housing of sensor module 1 which acts as a resonating choke which permits the transmitter to drive the transmission line against the plane of the housing.

Figure 8:
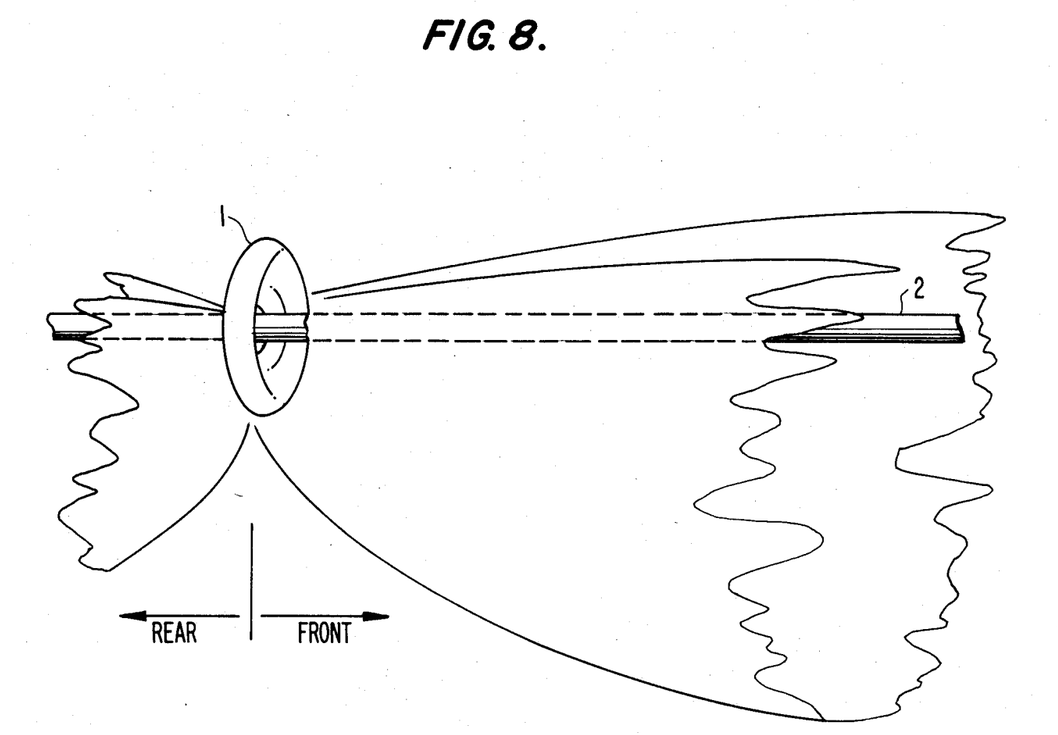
FIG. 8 shows the approximate radiation pattern resulting from the antenna system of the present invention.

The housing of sensor module 1 is insulated from conductor 2 by hard coat insulation 47 interposed between metal rings 13 and 14. The capacitance 48 formed across insulation 47 by the presence of rings 13 and 14 functions to couple the hub of module 1 to conductor 2 at high frequencies. The capacitance 48 is sufficiently large so as to appear as a short circuit to the transmitter operating frequency, e.g. 950 MHz in the preferred embodiment, and as an open circuit to the power conductor operating frequency which is typically 60 cycles per second. The resonating toroidal structure of module 1 and the conductor 2 acting as a line antenna cooperate to form the radiation pattern shown in FIG. 8. Note also that a capacitance 49 is formed between module 1 and ground shown as 50 which couples some radio frequency energy to ground and thereby influences the radiation pattern.

The impedance matching network 16 and the housing of module 1 function to divide conductor 2 into a front section on the side of the module 1 with network 16 and a rear section on the opposite side of module 1. The housing of module 1 inhibits the radio frequency energy from passing to the rear of the module 1 thereby directing the energy in a forward direction toward the ground receiver.

From the foregoing description, it can be seen how the present invention provides numerous advantages over the prior antenna systems. The antenna system of the present invention extends the operation of the sensor module over a wider frequency range with its broadband capabilities.

The impedance matching network allows the toroidal housing of the sensor module to function as a resonating choke which permits the module's transmitter to drive the transmission line. In addition, the hub of the sensor module is tightly capacitively coupled to the transmission line conductor at high frequencies. This enables the line conductor to act as a wire antenna which cooperates with the sensor module to provide an improved radiation pattern over the antennas of prior systems.

The present invention is not limited to the specific features detailed in the preferred embodiment described above. Various changes and modifications can be made without departing from the scope of the invention as defined in the claims.

I claim:

1. A device for monitoring at least one parameter of a power transmission line comprising means for sensing values of said parameter, means for processing said values, means for transmitting said values as signals and means for radiating said transmitted signals, wherein said means for radiating said transmitted signals includes an impedance matching network, a housing enclosing said device, and said power transmission line, and wherein said transmitting means transmits said signals at a given operating frequency, and said impedance matching network includes means for coupling said transmitting means to said housing to resonate said housing at said operating frequency, said housing including means for capacitively coupling said housing to said transmission line at said operating frequency.

2. A device according to claim 1 wherein said housing is toroidal in shape with an open center and said transmission line passes through the center of said toroidal housing.

3. A device according to claim 2 wherein said impedance matching network is attached to an outer surface of said housing and extends radially from said housing and toward a ground plane.

4. A device according to claim 3 wherein said impedance matching network comprises a printed circuit board and copper cladding affixed to said printed circuit board.

5. A device according to claim 1 wherein said operating frequency is within a frequency range of 925 MHz to 975 MHz.

6. A radiating antenna system comprising a means for transmitting signals, a resonant housing for radiating said transmitted signals, an impedance matching network for coupling said transmitting means to said resonant housing for radiating said transmitted signals, and a wire antenna coupled to said resonant housing for radiating said transmitted signals, wherein said housing is mounted on a transmission line conductor and said wire antenna comprises said transmission line conductor, and wherein said transmitting means transmits said signals at a given operating frequency and said impedance matching network couples said transmitting means to said housing to resonate said housing at said operating frequency, said housing including means for capacitively coupling said housing to said wire antenna at said operating frequency.

7. An antenna system according to claim 6 wherein said housing is toroidal in shape with an open center and said wire antenna passes through the center of said toroidal housing.

8. A power transmission control system for regulating the power flow over transmission lines including a device for monitoring at least one parameter of a power transmission line, a local station for receiving information from said device for monitoring and for operating on said information, and a central station for receiving said operated-on information from said local station and for controlling power distribution as a result of said received information, wherein said device for monitoring at least one parameter of said power transmission line comprises means for sensing values of said parameter, means for processing said values, means for transmitting signals representing said values, and means for radiating said transmitted signals toward said local station, wherein said means for radiating includes said power transmission line and a housing for encasing said device, and wherein said transmitting means transmits said signals at a given operating frequency and said means for radiating includes an impedance matching network for coupling said transmitting means to said housing to resonate said housing at said operating frequency, said housing including means for capacitively coupling said housing to said transmission line at said operating frequency.

9. A system according to claim 8 wherein said impedance matching network comprises a printed circuit board and copper cladding affixed to said printed circuit board.

10. A system according to claim 8 wherein said impedance matching network is attached to an outer surface of said housing and extends radially from said housing and toward a ground plane.

11. A system according to claim 10 wherein said operating frequency is within a frequency range of 925 MHz to 975 MHz.

* * * * *